United States Patent [19]

Niwa

[11] 4,283,677

[45] Aug. 11, 1981

[54] CLAMP TYPE GALVANOMETER

[76] Inventor: Shoji Niwa, 234 Gumyoji-cho, Minami-ku, Yokohama, Japan, 233

[21] Appl. No.: 40,324

[22] Filed: May 18, 1979

[51] Int. Cl.³ .......................................... G01R 1/22
[52] U.S. Cl. .................................. 324/127; 324/157; 336/176
[58] Field of Search ...................... 324/127, 129, 157; 336/84 M, 176

[56] References Cited

U.S. PATENT DOCUMENTS

| | | | |
|---|---|---|---|
| 1,906,812 | 5/1933 | Rowell | 324/127 |
| 2,476,121 | 7/1949 | Smith, Jr. | 336/84 M |
| 3,213,365 | 10/1965 | Wilson | 324/129 |
| 3,253,215 | 5/1966 | Moakler et al. | 324/127 |
| 3,403,656 | 10/1968 | Barry et al. | 324/157 |
| 3,571,772 | 3/1971 | Bennon et al. | 336/84 M |

*Primary Examiner*—Ernest F. Karlsen
*Attorney, Agent, or Firm*—George B. Oujevolk

[57] ABSTRACT

A clamp type galvanometer comprising a current transformer constituted from a coil-wounded split iron core pivotally secured so that it can be opened or closed, a lever for opening or closing said split iron core, a meter assembly consisting of a pointer and graduations for indicating the output of said current transformer through a cut-over circuit in the measuring range, and a grip for actuating said cut-over circuit in the measuring range. The device is compactly housed in a case of a size portable with one hand.

4 Claims, 11 Drawing Figures

FIG. 3
FIG. 4
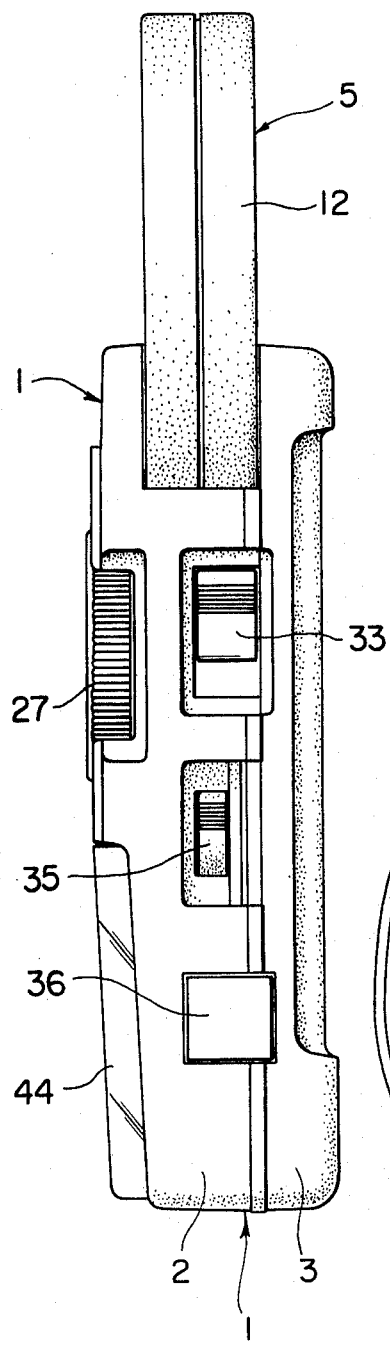
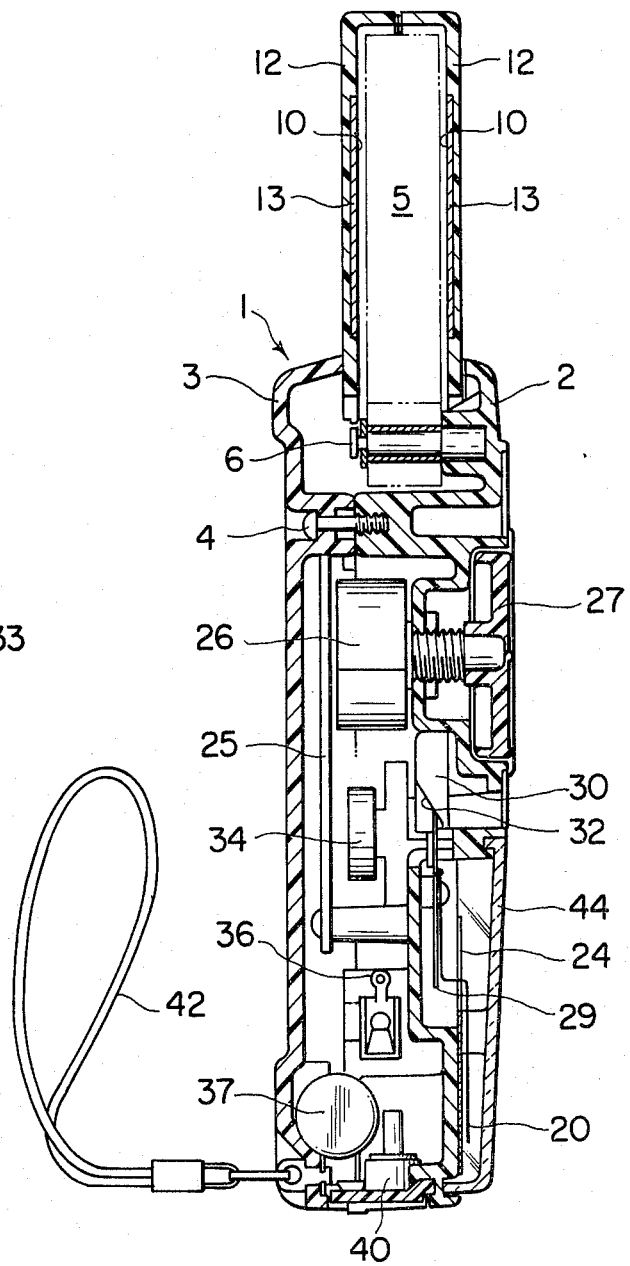

CLAMP TYPE GALVANOMETER

BACKGROUND OF THE INVENTION

This invention relates to a clamp type galvanometer for measuring the electric current in a wire by inserting the wire into an opening in a split iron core set in the device.

Generally, in the clamp type galvanometers using a current transformer with a split iron core, the magnetic resistance at the core joint becomes higher than that at the other parts to increase the residual current, and make the device susceptible to the influence of the external magnetic fields created by the neighboring wires, so that it was hardly possible with said type of conventional galvanometers to correctly measure a zero-phase current or a slight leak current flowing in a grounding conductor.

OBJECTS OF THE INVENTION

The principal object of this invention is to provide a clamp type galvanometer which is not only usable for measuring currents in ordinary wires but is also capable of correctly measuring even a slight leak current flowing in a grounding conductor, and which can be further used as a zero-phase ammeter.

Another object of this invention is to provide a clamp type galvanometer which is capable of measuring voltage and resistance in addition to current.

Still another object of this invention is to provide a clamp type galvanometer incorporated with a recorder means to allow continuous monitoring.

An additional object of this invention is to provide a clamp type galvanometer which is small in size and weight and hence convenient to carry and also easy to operate.

BRIEF DESCRIPTION OF THE DRAWINGS

FIG. 3 is a right-hand side view of FIG. 1;

FIG. 4 is a sectional view;

DETAILED DESCRIPTION OF THE INVENTION

Figure 6:
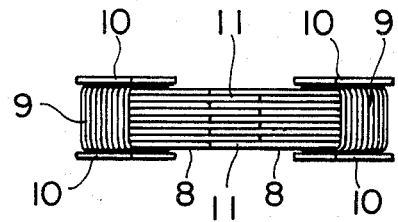
FIG. 6 is a plane view of the split iron core in the current transformer as taken from the joint end side thereof.
Figure 7:
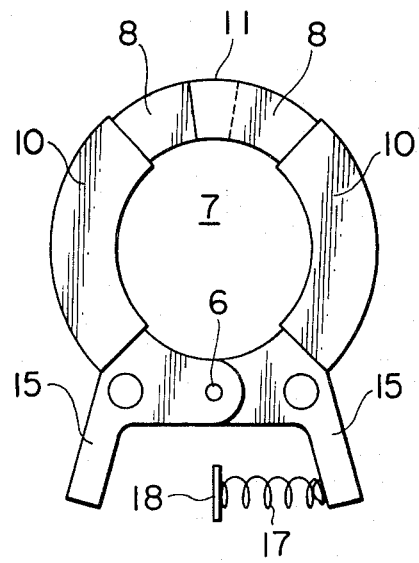
FIG. 7 is a front view of the current transformer.
Figure 8:
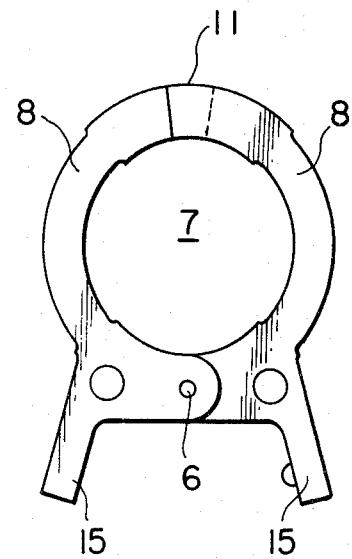
FIG. 8 is a front view of the split iron core alone.

Referring generally to the drawings, numeral 1 designates a case consisting of a body portion 2 made of an insulating material such as plastic and molded to a size holdable with one hand and a cover member 3 adapted to cover the rear side of the device, said both body portion 2 and cover member 3 being joined by means of screws 4 so that they can be separated from each other when so desired. Provided at an end of said case 1 is a current transformer 5 consisting of the halved iron core segments 8, 8 pivotally secured (6) at one end so that they are separable at other ends and also provided centrally thereof with an opening 7 for inserting a wire to be measured, coils 9, 9 wound on said respective iron core segments 8, 8, a pair of shield plates 10, 10 adapted to cover both sides of said respective coils 9, 9, and cover means 12, 12 designed to cover said respective core segments 8, 8 such that their engaging end portions 11, 11 project out. Each of said iron core segments 8, 8 consists of plural laminated sheets of Permalloy plates i.e., an alloy of 78.5% nickel 21.5% iron having the property to minimize the residual current, and they are arranged such that their engaging ends 11, 11 overlap each other as shown in FIG. 6 so that the magnetic resistance at this portion will approximate as much as possible to the magnetic resistance at other parts. The portion of each core segment 8 where the coil is to be wound is reduced in width as shown in FIG. 8 so that the coil wound thereon won't swell out beyond the normal plate width. This allows size reduction of the cover 10 as compared with one used for the conventional current transformer where coil is wound on each iron core segment without reducing the plate width.

Figure 9:
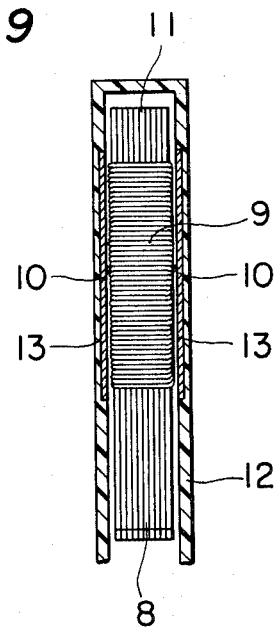
FIG. 9 is a sectional view showing a condition where a shield plate was secured to the transformer cover.

Said shield plates 10, 10 are made of the same material as said split iron core and are fitted in the respective recessions 13, 13 formed on the inner side of the covers 12, 12 as shown in FIG. 9 and fixed in position by a suitable means such as bonding with an adhesive.

Figure 1:
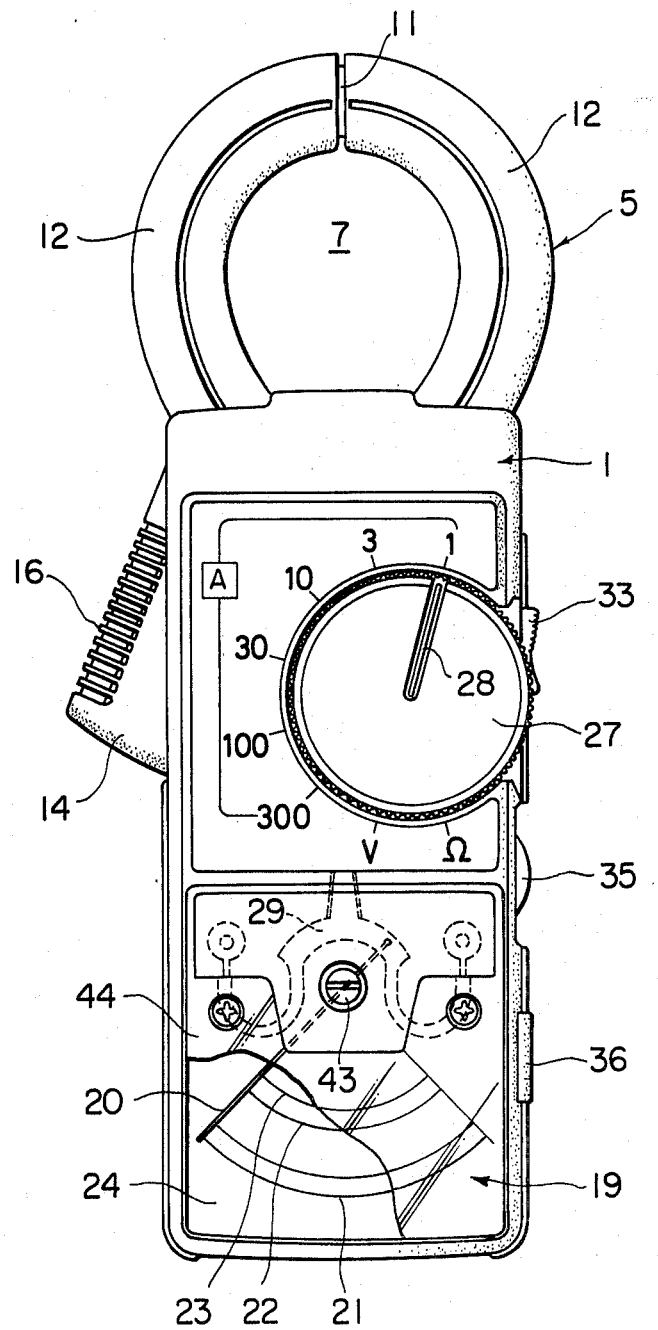
FIG. 1 is a front view showing a preferred embodiment of the clamp type galvanometer according to this invention.

Numeral 14 refers to a lever operable for opening or closing the engaging ends of the iron core segments 8, 8, said lever being formed integral with a cover 12 so as to cover one of the legs 15, 15 of the split iron core assembly. Said lever 14 projects aslant from the left-hand side of the device as seen from the position of FIG. 1, and anti-slip indentations 16 are provided on the projecting portion.

Disposed between the leg 15 of one of the iron core segments 8 and a detent 18 in the case 1 is a spring 17 which acts so as to keep the iron core segments 8, 8 normally closed at their engaging ends 11, 11, but when the lever 14 is pressed into the case 1 against the elastic force of said spring 17, the engaging ends 11, 11 of the iron core segments 8, 8 are opened out to allow insertion of a wire to be measured into the opening 7.

Designated by numeral 19 is a meter assembly provided on the front side of the case 1 and at a location close to the other end thereof, said meter assembly comprising a pointer 20 for indicating the output of the current transformer 5 and a scale plate 24 provided with graduations for current 21, graduations for voltage 22 and graduations for resistance 23 and covered with a transparent cover 44.

Figure 2:
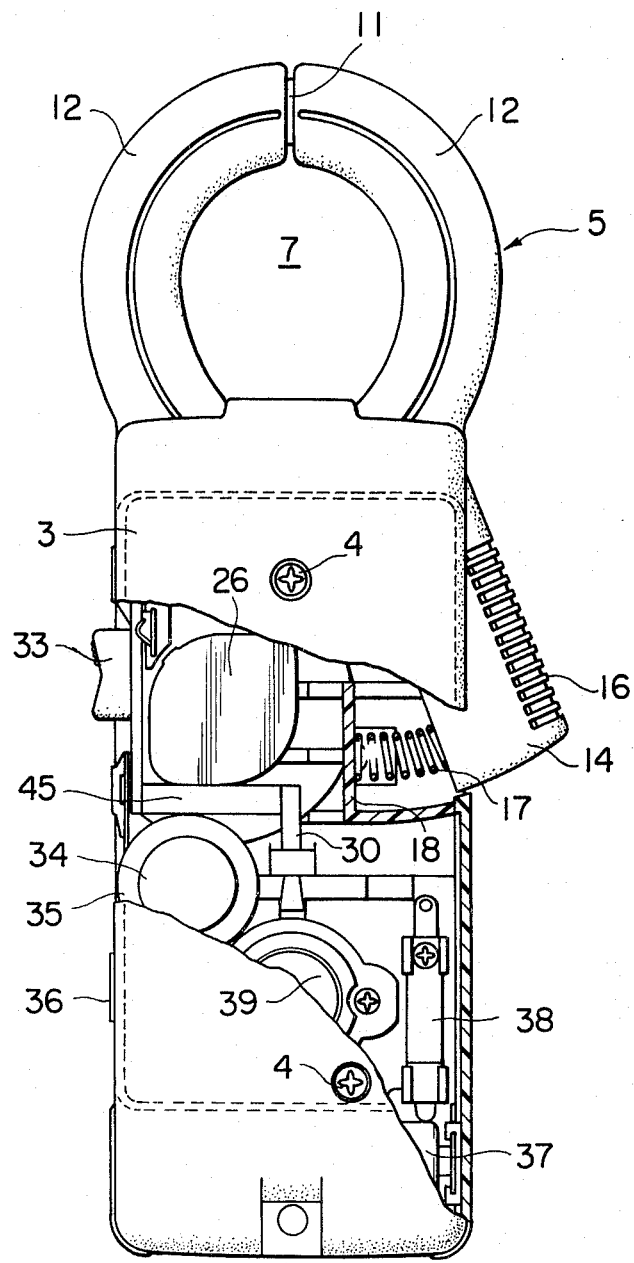
FIG. 2 is a rear view thereof, with parts cut away.
Figure 5:
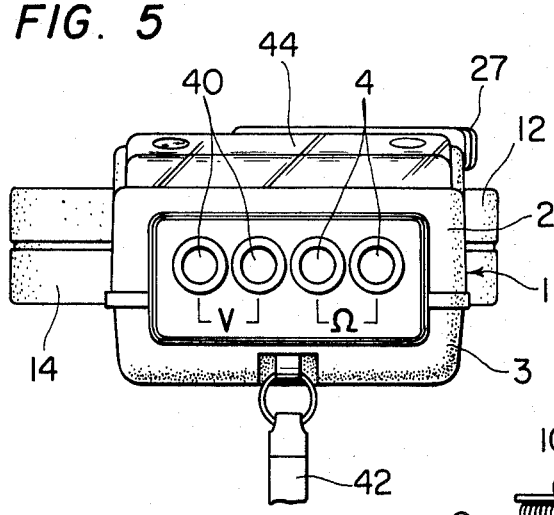
FIG. 5 is a bottom view.
Figure 10:
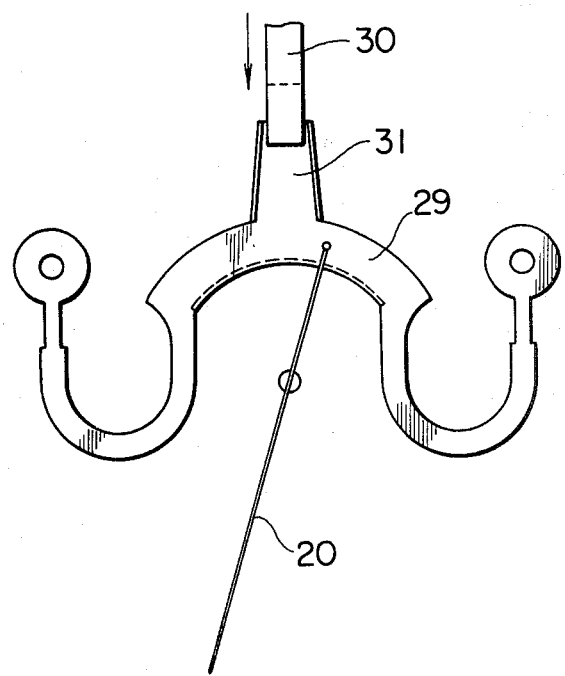
FIG. 10 is a front view showing the pointer locking mechanism.
Figure 11:
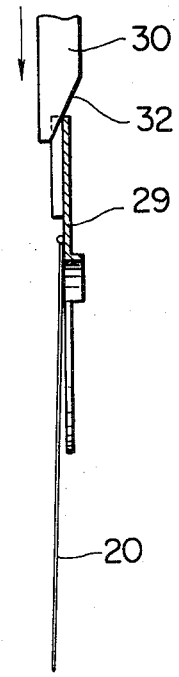
FIG. 11 is a central sectional view of FIG. 10.

25 is a printed matrix fixed in the case 1 and provided with a circuit for shunting the current according to the range of the current to be measured, a voltage measuring circuit and a resistance measuring circuit. 26 is a rotary switch for switching said circuits to let the pointer 20 swing accordingly, and 27 is a circular switching knob mounted on the shaft of said rotary switch 26 and disposed on the front side of the case 1 so that the indented part of its pherary projects out sidewise of the case 1. On the front face of the case 1 adjacent to the periphery of said knob 27 are given the amperage numbers 1, 3, 10, 30, 100 and 300 as well as letter A indicating current unit, letter V indicating voltage unit and letter Q indicating resistance unit. Desired measurement (measurement of amperage, voltage or resistance) can be made by turning the knob 27 to bring the indication line 28 on the knob surface into agreement with the corresponding indication (A, V or Q). 29 is a lock bar made from a leaf spring and disposed in the inside of the case 1 so that the proximal end of the pointer 20 is always in contact therewith within the range of swing of said pointer. 30 is a push bar having a tapered face 32 which abuts against a central protuberance 31 of said rocker bar 29. This push bar 30 is connected by a connecting bar 45 to a knob 33 provided slidably on a side of the case 1 opposite from the side where the lever 14 projects. When this knob 33 is slided from the position shown in FIGS. 2 and 3 to its opposite position, the push bar 30 is depressed in the direction of arrow in FIGS. 10 and 11 so that the tapered face 32 presses the lock bar 29 against its elastic force to let it separate from the position in contact with the pointer 20 to unlock said pointer 20. If the knob 33 is returned to its original position during measurement, the pointer 20 can be locked to the position of indication. 34 is a zero-adjusting volume for measurement of resistance, and 35 is a turn knob for said volume 34. Said turn knob 35 is disposed below the knob 33. Provided below said knob 35 is a jack 36 for connecting a recorder for recording the values indicated by the pointer 20, said recorder being provided with a dust cover. Numeral 37 denotes a battery, 38 a fuse, 39 a dust seal for the meter assembly, 40 a jack for measurement of voltage provided at the bottom of the case 1, and 41 another jack for measurement of resistance provided in juxtaposition with the first-said jack 40. Attaching plugs are screwed into these members to secure them in position. 42 is a hang strap forming a ring sufficient to allow insertion of the user's wrist, and 43 is a zero-adjusting screw for the meter assembly 19.

As viewed above, this invention features use of Permalloy as iron core material, formation of the split iron core assembly by laminating the Permalloy plates so that the respective core plates overlap with each other at their engaging ends to thereby reduce magnetic resistance at the engaging ends as compared with the conventional split iron core assemblies, and symmetrical winding of the coils on the respective iron core segments to minimize the output by the leak magnetic flux produced in the coils no matter what position of the opening of the iron core assembly is passed the wire to be measured, and these features conduce to a notable improvement of the residual current characteristics in comparison with the conventional clamp type galvanometers. Also, adaptation of the shield plates in this invention can prevent any adverse effect of the external magnetic fields by the neighboring wires on the split iron core assembly and coils.

It is thus possible according to this invention to produce a full-scale high-sensitivity clamp type galvanometer which can measure not only the currents in the ordinary wires but also even a slight current flowing in a grounding conductor, a zero-hase current in a single- or three-phase circuit or a coil current flowing through the relays, microswitches, etc., in a control board. It is also possible to measure voltage and resistance. Because of such improved performance of the device, continuous monitoring of the circuits is possible even if a recorder is connected. Also, since the assembling parts are all incorporated in a case that can be carried with one hand, there can be proviced a clamp type galvanometer which is small in size, light in weight and convenient to carry with. Further, the lever and switching knobs can be operated with one hand, and if the looped hang strap is placed round the operator's wrist, there is no fear that the meter be dropped and damaged in use.

What is claimed is:

1. A clamp type galvanometer, comprising:
   (a) current transformer means (5) including a core assembly of laminated plates made of an alloy of about 78.5% nickel and about 21.5% iron, said core assembly being split to provide two half core segments (8), said segments being pivotally secured at one end and overlapping each other at the other end, a portion of each plate where a coil is to be wound being reduced in width;
   (b) a coil (9) wound around each segment at such reduced width portion;
   (c) a shield plate (10) disposed over each coil;
   (d) a lever (14) for opening or closing the overlapping other end of said segments;
   (e) a case wherein said one end of said segments are pivotally secured, said case being of a size carriable with one hand, said lever extending out of said case;
   (f) a meter assembly (19) with a pointer and graduations for indicating the output of said current transformer means displayed on said case, and including first circuit means with current measuring means operatively coupled to said current transformer means (5) to indicate the output of said current transformer means with said pointer and graduations;
   (g) a printed circuit (25) having shunt circuit means in said meter assembly for measuring various ranges of current;
   (h) a circular switching knob (27) coupled to said shunt circuit means for operating said printed circuit so as to determine the measuring range being measured; and,
   (i) a lock bar (29) disposed for being in contact with or separate from said pointer with a second knob (33) for operating said lock bar, said second knob being at the side of the case.

2. A clamp type galvanometer according to claim 1, wherein graduations for voltage and graduations for resistance are provided in addition to graduations for amperage on the scale in the meter assembly, and a jack for measurement of voltage and a jack for measurement of resistance are provided in the case, with an attaching plug being screwed into each said jack to secure it in position.

3. A clamp type galvanometer as claimed in claim 1 having a looped hang strap allowing passage of a human hand and wrist is attached to the case.

4. A clamp type galvanometer as claimed to claim 3 including covers over said segments, said covers having each an inner side with a recession formed therein, said shield plates being disposed in the respective recessions, and bonding means bonding said shield plates to said covers.

* * * * *